United States Patent [19]
Przilas et al.

[11] Patent Number: 6,139,361
[45] Date of Patent: Oct. 31, 2000

[54] HERMETIC CONNECTOR FOR A CLOSED COMPARTMENT

[75] Inventors: Mark B. Przilas, Greenville; Robert H. Mimlitch, III, Rowlett; Robert A. Bruce, Greenville, all of Tex.

[73] Assignee: Raytheon Company, Lexington, Mass.

[21] Appl. No.: 09/152,738

[22] Filed: Sep. 14, 1998

Related U.S. Application Data

[62] Division of application No. 08/834,502, Apr. 4, 1997, Pat. No. 5,907,473.

[51] Int. Cl.⁷ ............................................... H01R 1/01
[52] U.S. Cl. ..................................................... 439/559
[58] Field of Search ................... 439/559, 587, 439/589, 347

[56] References Cited

U.S. PATENT DOCUMENTS

| | | | |
|---|---|---|---|
| H1145 | 3/1993 | Anderson | 165/61 |
| 2,845,472 | 7/1958 | Narbut | 174/15.1 |
| 2,901,893 | 9/1959 | Saltzman | 62/314 |
| 2,906,103 | 9/1959 | Saltzman | 62/231 |
| 3,004,406 | 10/1961 | Foote, et al. | 62/373 |
| 3,339,373 | 9/1967 | Mobius et al. | 62/64 |
| 3,725,566 | 4/1973 | Plizak | 174/15.1 |
| 3,801,241 | 4/1974 | Martin et al. | 418/152 |
| 3,803,531 | 4/1974 | Sorensen | 439/559 |
| 3,997,376 | 12/1976 | Hemsath et al. | 148/143 |
| 4,056,949 | 11/1977 | Hahn | 62/373 |
| 4,111,614 | 9/1978 | Martin et al. | 417/420 |
| 4,127,365 | 11/1978 | Martin et al. | 417/420 |
| 4,163,164 | 7/1979 | Pieters | 310/103 |
| 4,165,206 | 8/1979 | Martin et al. | 417/310 |
| 4,352,392 | 10/1982 | Eastman | 165/104.25 |
| 4,371,149 | 2/1983 | Takeuchi et al. | 266/90 |
| 4,399,484 | 8/1983 | Mayer | 361/689 |
| 4,407,136 | 10/1983 | de Kanter | 62/64 |
| 4,493,625 | 1/1985 | Pieters | 418/126 |
| 4,498,118 | 2/1985 | Bell | 361/694 |
| 4,629,269 | 12/1986 | Kailus | 439/587 |
| 4,666,228 | 5/1987 | Wood | 439/559 |
| 4,711,431 | 12/1987 | Viannay et al. | 266/114 |
| 4,715,189 | 12/1987 | Hohenwarter | 62/64 |

(List continued on next page.)

FOREIGN PATENT DOCUMENTS

| | | |
|---|---|---|
| 0 480 750 A2 | 4/1992 | European Pat. Off. . |
| 63120449 | 5/1988 | Japan . |
| 2 003 336 | 3/1979 | United Kingdom . |
| WO 91/20083 | 12/1991 | WIPO . |

OTHER PUBLICATIONS

Donald E. Tilton, Charles L. Tilton, Clifford J. Moore, and Randy E. Ackerman, "Spray Cooling for the 3–D Cube Computer", 1994 InterSociety Conference on Thermal Phenomena, pp. 169–176.

Donald E. Tilton, Donlad A. Kearns, and Charles L. Tilton, "Liquid Nitrogen Spray Cooling of a Simulated Electronic Chip", *Advances in Cryogenic Engineering*, Vol. 39, pp. 1779–1786.

Donald E. Tilton, Charles L. Tilton, Martin R. Pais, "High––Flux Spray Cooling in a Simulated Multichip Module", pp. 1–7.

*Primary Examiner*—T. C. Patel
*Attorney, Agent, or Firm*—Baker Botts L.L.P.

[57] ABSTRACT

A hermetic connector for use with a closed compartment includes a connector body having a mounting plate that overlaps an opening in the closed compartment. Electrical or optical connections are made between the internal and external sides of the compartment by a pair of mating connectors each having a contact area. The contact area includes a plurality of single piece pins or a socket connecting to similar pins of the mating connector. The hermetic connector further includes an o-ring seal surrounding one of the connectors and squeezed between the connector body and the interior side of the closed compartment. A plurality of mounting screws extend through mounting holes of the connector body for attachment of the connector to the closed compartment.

2 Claims, 10 Drawing Sheets

U.S. PATENT DOCUMENTS

| | | | |
|---|---|---|---|
| 4,750,086 | 6/1988 | Mittal | 361/382 |
| 4,838,041 | 6/1989 | Bellows | 62/51.2 |
| 4,846,641 | 7/1989 | Pieters et al. | 418/70 |
| 4,866,570 | 9/1989 | Porter | 361/382 |
| 4,897,762 | 1/1990 | Daikoku et al. | 361/382 |
| 4,912,600 | 3/1990 | Jaeger et al. | 361/385 |
| 5,021,001 | 6/1991 | Ramirez | 439/578 |
| 5,021,924 | 6/1991 | Kieda et al. | 361/385 |
| 5,023,695 | 6/1991 | Umezawa et al. | 357/82 |
| 5,029,635 | 7/1991 | Callero et al. | 165/80.4 |
| 5,050,037 | 9/1991 | Yamamoto et al. | 361/385 |
| 5,067,047 | 11/1991 | Azar | 361/384 |
| 5,096,390 | 3/1992 | Sevrain et al. | 417/420 |
| 5,097,385 | 3/1992 | Chu et al. | 361/382 |
| 5,129,449 | 7/1992 | Nguyen | 165/110 |
| 5,131,233 | 7/1992 | Cray et al. | 62/64 |
| 5,183,104 | 2/1993 | Novotny | 165/104.33 |
| 5,220,804 | 6/1993 | Tilton et al. | 62/64 |
| 5,228,502 | 7/1993 | Chu et al. | 165/80.4 |
| 5,239,443 | 8/1993 | Fahey et al. | 361/689 |
| 5,263,536 | 11/1993 | Hulburd et al. | 165/80.4 |
| 5,264,984 | 11/1993 | Akamatsu | 361/689 |
| 5,270,572 | 12/1993 | Nakajima et al. | 257/714 |
| 5,310,440 | 5/1994 | Zingher | 156/345 |
| 5,311,931 | 5/1994 | Lee | 165/109.1 |
| 5,316,075 | 5/1994 | Quon et al. | 165/80.4 |
| 5,320,554 | 6/1994 | Freer et al. | 439/347 |
| 5,349,831 | 9/1994 | Daikoku et al. | 62/376 |
| 5,384,687 | 1/1995 | Sano | 361/689 |
| 5,388,635 | 2/1995 | Gruber et al. | 165/80.4 |
| 5,390,076 | 2/1995 | Umezawa | 361/689 |
| 5,406,807 | 4/1995 | Ashiwake et al. | 62/376 |
| 5,412,536 | 5/1995 | Anderson et al. | 361/700 |
| 5,435,884 | 7/1995 | Simmons et al. | 216/100 |
| 5,436,501 | 7/1995 | Ikeda | 257/714 |
| 5,463,528 | 10/1995 | Umezawa | 361/699 |
| 5,465,192 | 11/1995 | Yoshikawa | 361/705 |
| 5,491,363 | 2/1996 | Yoshikawa | 257/715 |
| 5,931,697 | 8/1999 | Jeong | 439/559 |

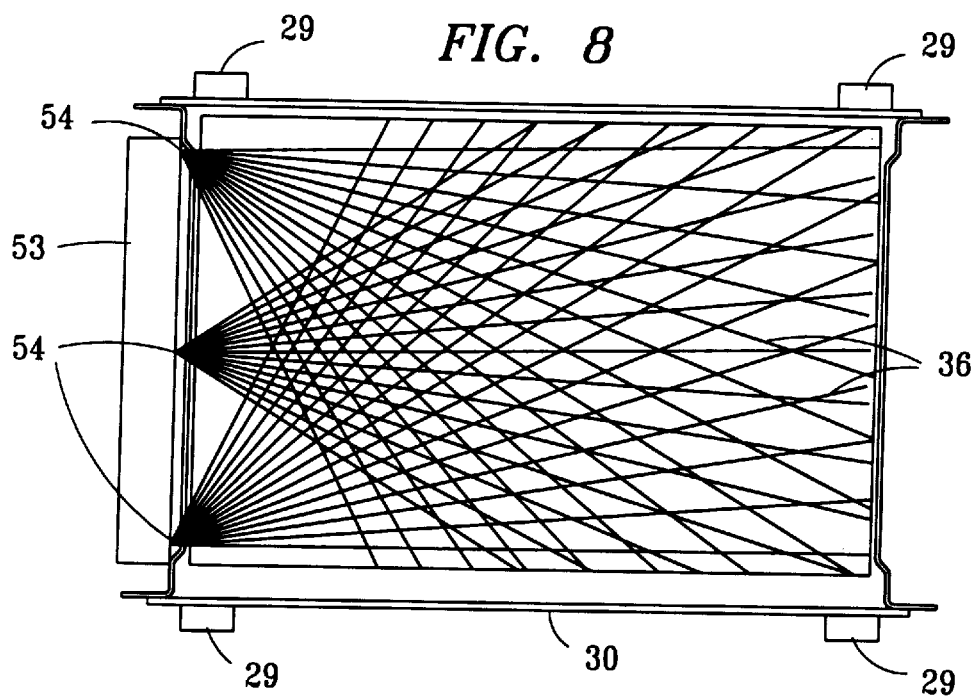
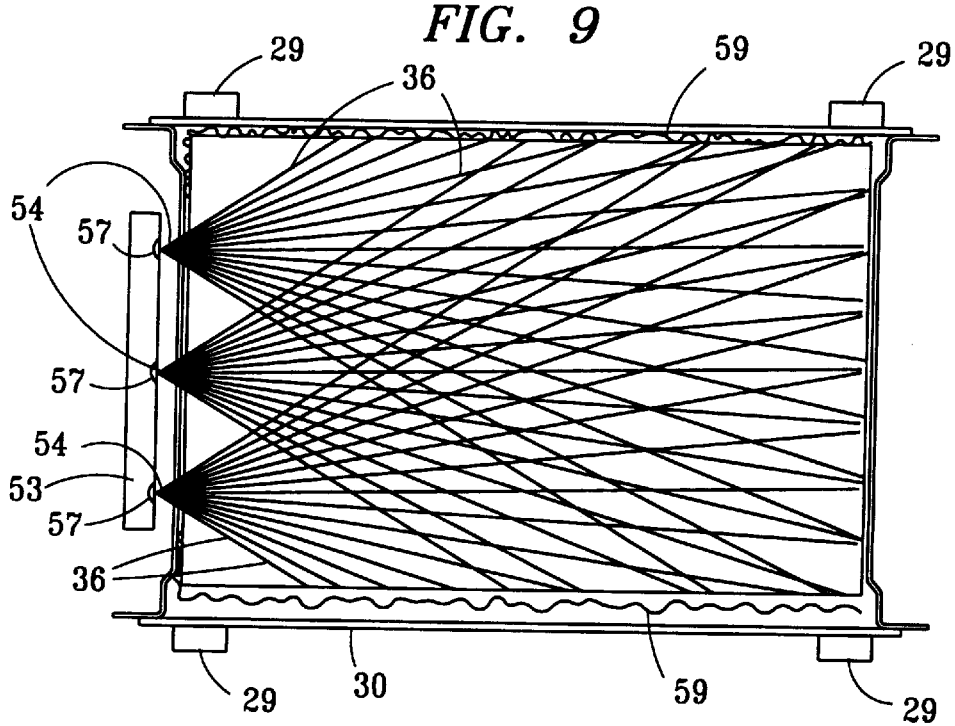

HERMETIC CONNECTOR FOR A CLOSED COMPARTMENT

This application is a divisional of application Ser. No. 08/834,502, filed Apr. 4, 1997, now U.S. Pat. No. 5,907,473, by Mark B. Przilas, Robert H. Mimlitch, III, and Robert A. Bruce, and entitled "Environmentally Isolated Enclosure for Electronic Components."

TECHNICAL FIELD

The present invention relates to a connector for spray cooled enclosure and, more particularly, to a hermetic connector for a closed chamber providing an improved environment for electronic equipment.

BACKGROUND OF THE INVENTION

A thermal control system is required to maintain the operability of electronic components disposed within an enclosure located in a hostile environment. It is recommended that the thermal control system maintain a maximum operating temperature for electronic components in the range of 70°–80° C. independent of the environment outside the chassis. The maximum operating temperature range of 70°–80° C. is variable because the electronic components typically have different specifications and grades. Hostile environments having extreme operating conditions such as high or low temperatures may also include elements such as salt, fog, dust, sand, humidity or other contaminants. Also, extreme operating conditions having low temperatures near –40° C. make it difficult for commercial electronic components to operate.

Traditional thermal control systems designed to operate at the chassis level include technologies such as free or forced air convection, conduction, liquid cooling, and immersion cooling. The free or forced air convection approach of directly cooling electronic components is problematic, because the components are often introduced to dust, salt, moisture or other damaging elements. Furthermore, the convection approach alone is not an adequate way of heating the electronic components operating in temperatures ranging from –40° through 0° C.

The conductive approach uses heat sinks, cold plates or thermal planes to absorb and transport heat generated by the electronic components. The heat sinks, cold plates and thermal planes must physically contact the electronic components, therefore, limiting design flexibility and increasing the weight of the enclosure. The increased weight further reduces the enclosure operational limits by narrowing the vibrational limits of electronic components. Also, the conductive approach is undesirable due to the cost associated with cold plates and thermal planes. An additional disadvantage associated with conductive cooling is that the additional thermal mass limits the ability to heat the electronic components to acceptable limits when the electronic components are operating at low temperatures.

The efficiency of the conductive approach using the cold plates may be enhanced by adding thermal bags or thermally conductive foams to improve a conductive path between the cold plate and electronic components. However, the additional cost and weight are still disadvantages associated with the thermal bags or thermally conductive foams.

Generally the liquid cooling and immersion cooling approaches are more effective than the convection or conduction approaches. However, the liquid cooling approach requires complex fluid and tubing distribution schemes that are very expensive, and the immersion cooling approach has disadvantages attributable to the added weight and nucleate boiling hysteresis associated with immersing the electronic components in the fluid.

U.S. Pat. No. 5,220,804, issued to Tilton et al., discloses an array of perpendicular atomizers that spray cooling liquid onto electronic components. The atomizers include nozzles that individually direct the cooling liquid to a corresponding electronic component.

U.S. Pat. No. 5,311,931, issued to Lee, discloses a method of generating a spray, mist that forms an ultra-thin coolant film and intentionally produces a vortex within a cavity associated with electronic components.

U.S. Pat. No. 4,399,484, issued to Mayer, discloses a jet cooling system that has direct impingement fluid flow perpendicular to a surface of a printed circuit board. The printed circuit board has passages for the cooling fluid.

U.S. Pat. No. 5,349,831, issued to Daikoku et al., discloses a device that discharges cooling fluid having a perpendicular flow to electronic components.

U.S. Pat. No. 5,021,924 discloses a semiconductor cooling device having a plurality of nozzles associated with each electronic component. The nozzles are located at substantially the same level with the surface of the electronic component.

Accordingly, there is a need for an enclosure to provide an improved environment for electronic components that are located within the enclosure. Also there is a need for an enclosure having a significantly increased cooling and/or heating capacity. These and other needs are addressed by the spray cooled enclosure of the present invention.

SUMMARY OF THE INVENTION

The present invention is a spray cooled enclosure and method for obtaining a substantially improved environment for a plurality of electronic cards or heat generating components located within the self contained enclosure. The enclosure includes a closed compartment that isolates the electronic components from the environment. A dielectric heat transfer fluid located within the closed compartment is distributed by a spraying system such that a layer of the heat transfer fluid is continually formed over a substantial portion of the electronic cards. Also included is a condensing system for condensing the heat transfer fluid vaporized in response to heat transferred from the electronic cards to the layer of heat transfer fluid.

In accordance with the present invention there is provided a spray cooled enclosure having a stabilized environment with a substantially uniform temperature distribution of approximately +/–10° C. across a plurality of electronic components.

Further in accordance with the present invention there is provided a spray cooled enclosure having a significantly increased cooling and/or heating capacity.

Also in accordance with the present invention there is provided a spray cooled enclosure having a connector that maintains a pressure seal in a closed compartment of the enclosure.

Further in accordance with the present invention there is provided a spray cooled enclosure having superior platform heat extraction systems.

In accordance with the present invention there is provided a spray cooled enclosure suitable for airborne, ship and ground based applications.

BRIEF DESCRIPTION OF THE DRAWINGS

A more complete understanding of the invention may be had by reference to the following Detailed Description when taken in conjunction with the accompanying Drawings wherein:

FIG. 8 is a plan view of an array of nozzles distributing heat transfer fluid within a card cage;

FIG. 9 is a plan view of a second embodiment of an array of nozzles distributing heat transfer fluid within the card cage;

DETAILED DESCRIPTION OF THE DRAWINGS

Figure 1:
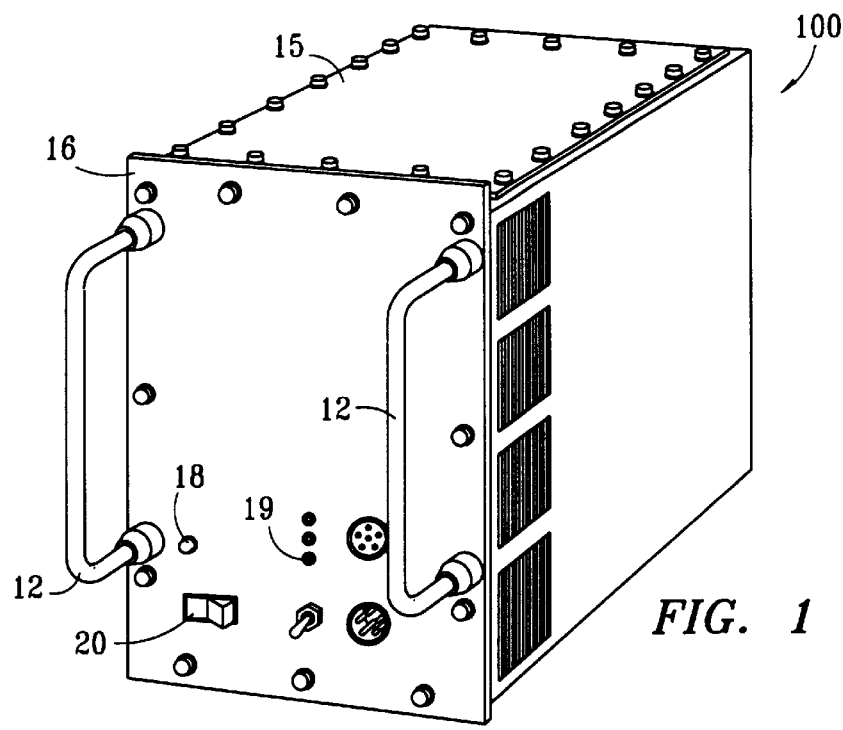
FIG. 1 is a perspective view of a spray cooled enclosure of the present invention.

Referring to the Drawings, wherein like numerals represent like parts throughout the several views, there is disclosed a spray cooled enclosure 100 in accordance with the present invention.

Although four embodiments of the enclosure 100 will be discussed, those skilled in the art will appreciate that such embodiments are only four of many utilizing the principles of the present invention. Accordingly, the enclosure 100 described herein should not be construed in a limiting manner.

Referring to FIG. 1, there is shown a perspective view of the enclosure 100. The enclosure 100 preferably has a rectangular configuration designed to readily slide into and out of a conventional instrumentation rack (not shown); however, other configurations are permissible. A pair of handles 12 may be provided on opposing sides of the enclosure 100 to aid in removing and installing the enclosure. A face plate 16 located at an end of the enclosure 100 is attached to an enclosure housing 15 with the handles 12 attached to the face plate. The face plate 16 typically has a variety of control indicators and switches including a fluid level indicator 18, a power indicator 19 and a power switch 20. The enclosure 100 is constructed of materials that provide isolation from hostile conditions such as humid air, salt air, shock and vibration.

Figure 2:
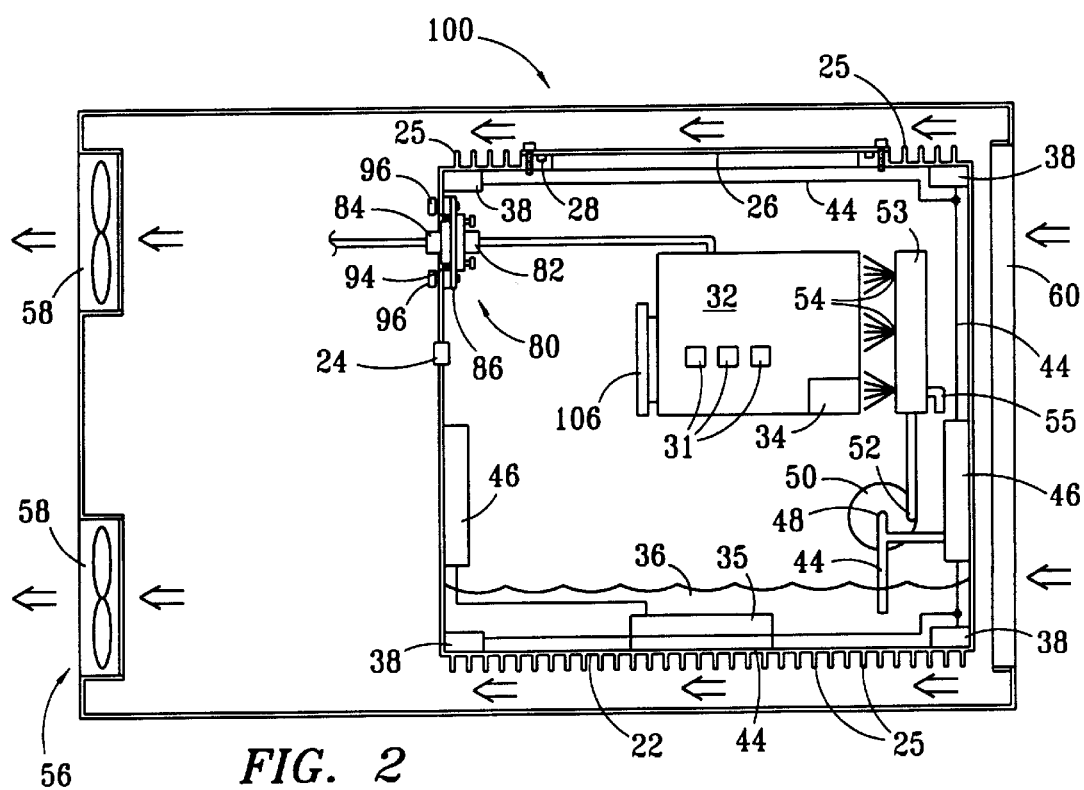
FIG. 2 is a schematic diagram of a first embodiment of the spray cooled enclosure.

Referring to FIG. 2, there is illustrated a schematic diagram of the first embodiment of the enclosure 100. The second embodiment (FIGS. 3A and 3B), the third embodiment (FIG. 4), and the fourth embodiment (FIG. 5) have different condensing systems that are described in detail later.

Referring to FIGS. 2–5, all four embodiments of the enclosure 100 have a closed compartment 22 located within the enclosure. The closed compartment 22 incorporates a pressure relief mechanism 24 sized to open or leak in the event the pressure within the closed compartment exceeds a predetermined value. The closed compartment 22 also includes at least one access panel 26 having a gasket 28 designed to substantially seal the compartment and reduce electromagnetic emissions.

The closed compartment 22 encloses a modular card cage 30 (see FIG. 14) designed to hold a plurality of electronic components/cards 32. The electronic cards 32 are preferably VME 6U–160 mm commercial cards, however, other sizes of electronic cards may be installed within the card cage 30. One or more power supplies 34 are provided to energize all of the electrical components assembled within the enclosure 100. The power supplies 34 may be located within or outside of the enclosure 100. The card cage 30 will be described in detail later.

Each electronic card 32 under normal operating conditions would typically dissipate approximately 45 Watts; however, higher power dissipation may be accommodated by the enclosure 100. The electronic cards 32 or electronic components 31 located thereon would not function properly unless the dissipated heat was absorbed by a cooling system such as a dielectric heat transfer fluid 36 (i.e. hydrofluorocarbons). The heat transfer fluid 36 located within the closed compartment 22 is a non-conductive, nonflammable, and inert fluid that removes the dissipated heat through convection and evaporation.

One available heat transfer fluid 36 is manufactured by Minnesota Manufacturing and Mining, Inc. and known as FLUORINERT (™) with part number FC-72. Table 1, below, sets forth the boiling points at one atmosphere for various types of heat transfer fluid 36 sold under the trademark FLUORINERT.

TABLE 1

| FLUORINERT (TM) Boiling Points | |
|---|---|
| Part Number | Temperature (° C.) |
| FC87 | 30 |
| FC72 | 56 |
| FC84 | 80 |

The various heat transfer fluids of Table 1 may be mixed to obtain any desired boiling point between 30° and 80° C. The heat transfer fluid 36 has a dielectric strength in excess of 35,000 volts per 0.1 inch gap.

A spraying system is provided in the closed compartment 22 to collect and continually distribute the heat transfer fluid 36 in the form of a thin-film layer covering a substantial portion of the electronic cards 32. The thin-film layer of heat transfer fluid 36 evaporates as the fluid absorbs the heat generated by electronic components 31 on the electronic cards 32. The power dissipated by the electronic components 31 cause the thin-film layer of heat transfer fluid 36 to evaporate and absorb sufficient heat to maintain the component at an operating temperature relative to the boiling point of the heat transfer fluid.

The closed compartment 22 may have an acceptable leakage rate of the heat transfer fluid 36 such that the operation of the enclosure 100 is not adversely affected. The acceptable leakage rate may have a total duration of a few minutes to an infinite life based on sealing materials and operating conditions. The leak rate varies depending on factors such as the volume of the closed compartment 22, the quantity of heat transfer fluid 36 and the operating conditions.

Figure 6A:
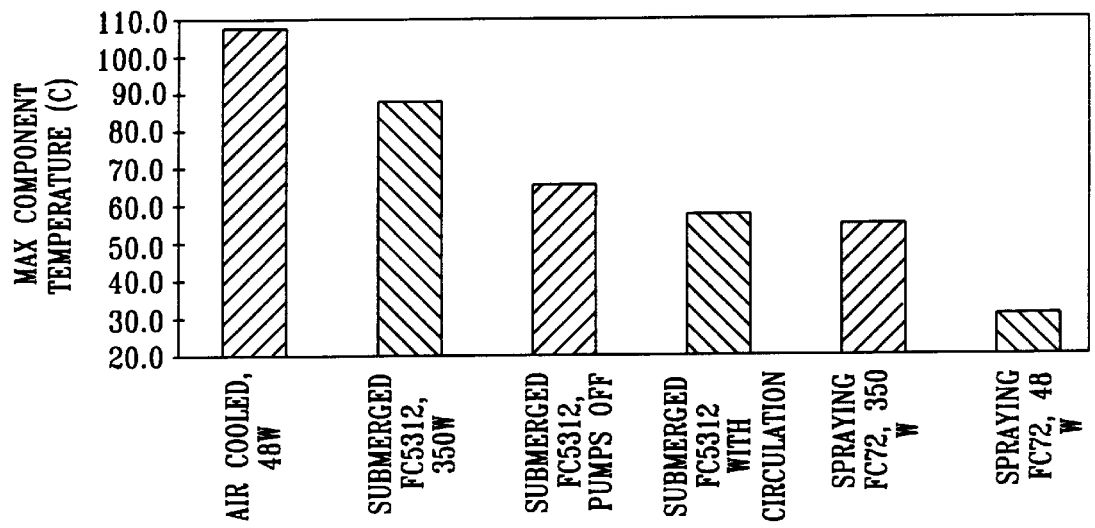
FIG. 6A is a graph illustrating the maximum temperatures of electronic components operating in an improved environment obtained by using various cooling systems.

Referring to FIG. 6A, there is a graph illustrating the maximum temperatures of the electrical components 31 operating in an environment obtained by various cooling systems. The electrical components 31 are either air cooled, submerged in the heat transfer fluid 36 with or without circulation, or spray cooled.

Figure 6B:
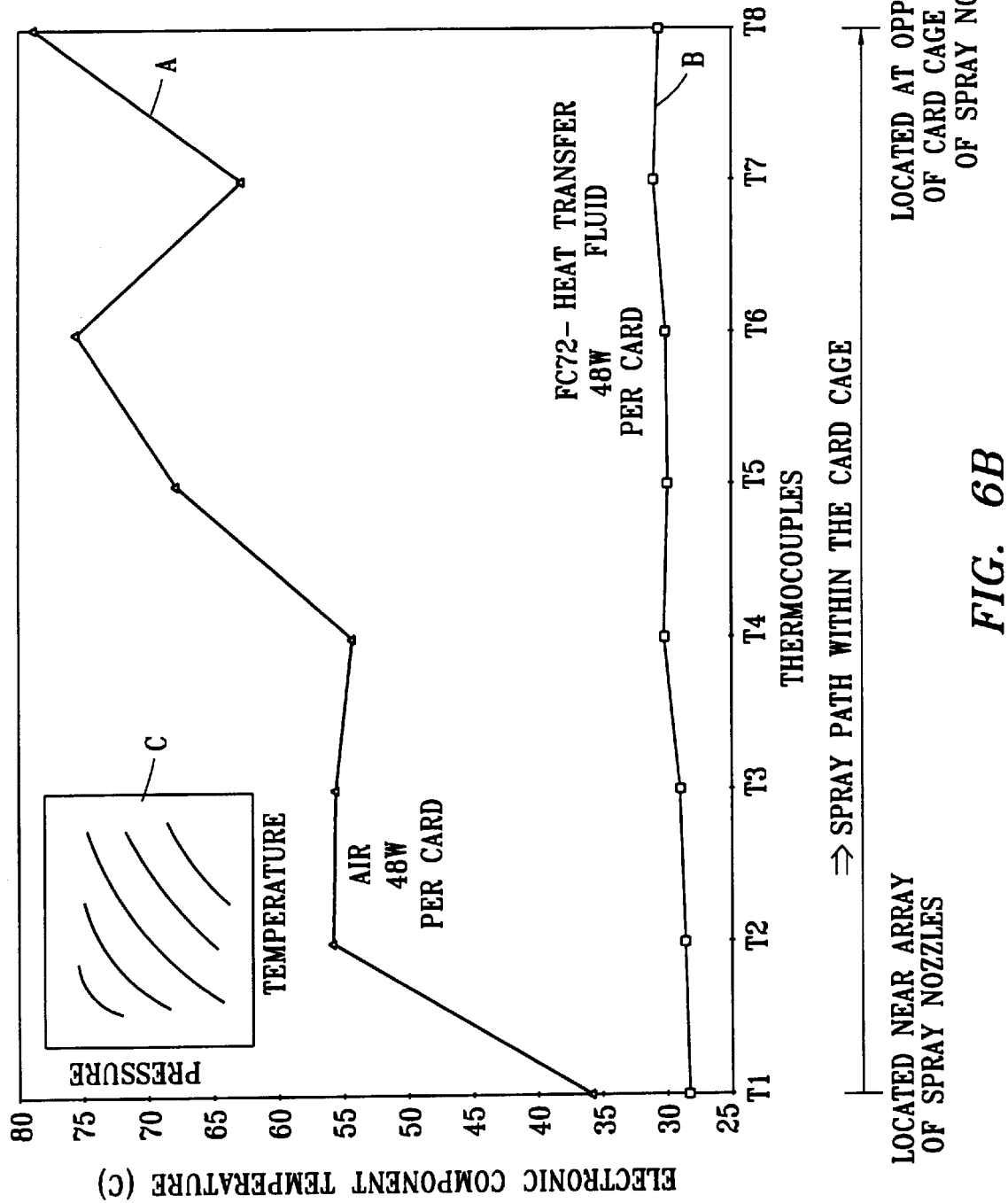
FIG. 6B is a graph comparing thermal gradient reductions achieved by a spray cooled system and an air convection system.

Referring to FIG. 6B, there is a graph comparing thermal gradient reductions achieved by a spray cooled system and an air convection system. On the X-axis of the graph there are indicated seven thermocouples T1 thru T7, where thermocouple T1 is located near the output of the array of nozzles 54 and thermocouple T7 is located at an opposite end of the card cage 30 (See FIG. 3A.) The results of the air convection system represented by line "A" indicates a substantially higher temperature associated with the electronic components 31 positioned on the card cage 30 than indicated by the spray cooled system represented by line "B".

Data measured utilizing the spray cooled system indicates that as the heat transfer fluid 36 flows from the thermocouple T1 to the thermocouple T7 the pressure within the card cage 30 and temperature of the vaporized and liquid heat transfer fluid 36 continually rise as they are measured from the thermocouple T1 to the thermocouple T7 (See graph "C".) While the temperature of the electronic components 31 that generate approximately 48 Watts/per card remains substantially constant as measured from the thermocouple T1 to the thermocouple T7.

Figure 6C:
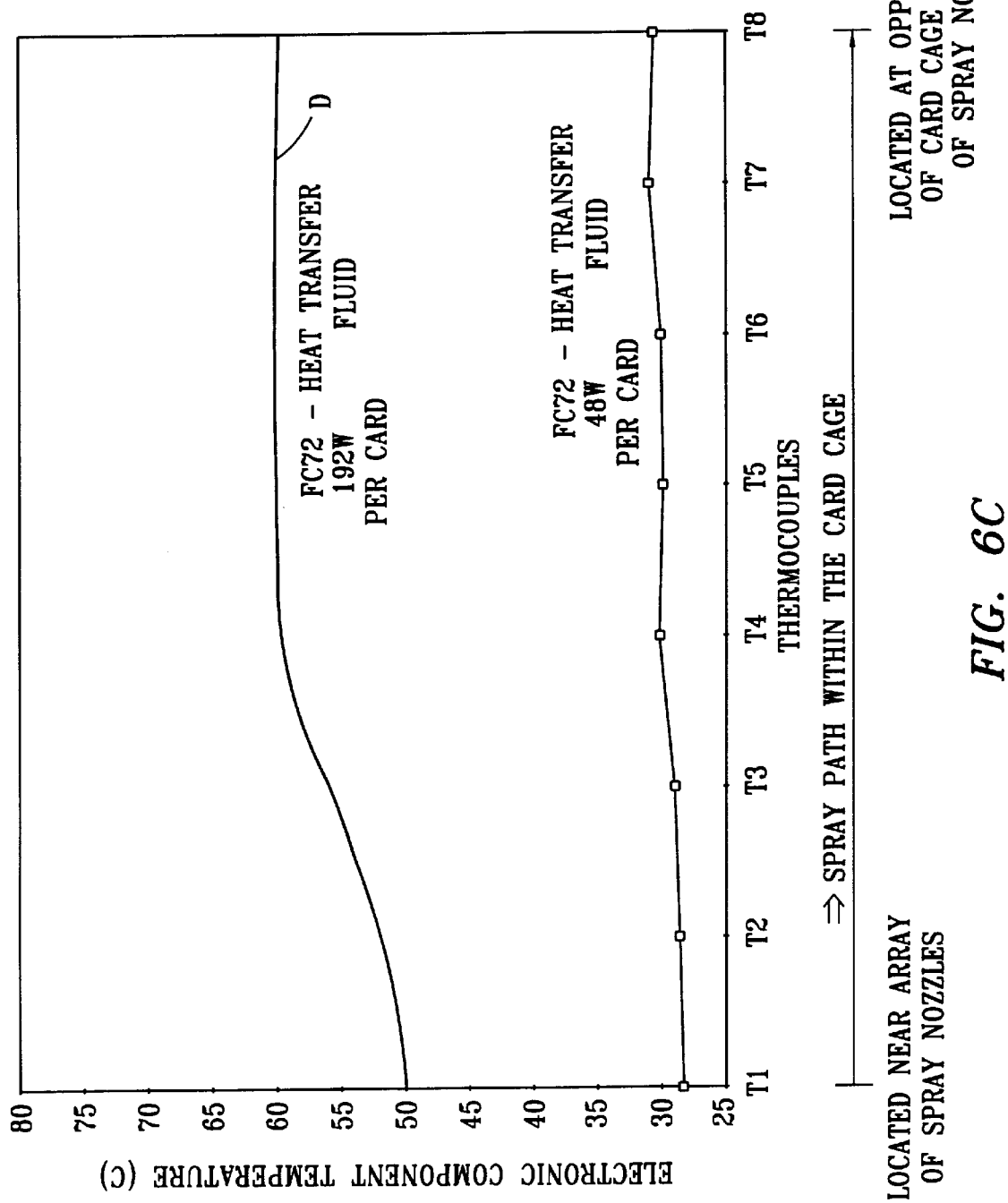
FIG. 6C is a graph comparing thermal gradient reductions achieved by the spray cooled system having various thermal loads.

Referring to FIG. 6C, there is a graph comparing thermal gradient reductions achieved by a spray cooled system. FIG. 6C is similar to FIG. 6B except that the air convection system measurements have been substituted for a spray cooled system having electronic cards 32 that generate approximately 192 Watts/per card on line "D". The graph indicates that the temperature of the electronic components 31 associated with line "D" have a substantially constant temperature of approximately 60° C. as measured from the thermocouple T3 to the thermocouple T7. While as the heat transfer fluid 36 flows from the thermocouple T1 to the thermocouple T7 the pressure within the card cage 30 and temperature of the vaporized and liquid heat transfer fluid 36 continually rise as they are measured from the thermocouple T1 to the thermocouple T7 (See graph "C" of FIG. 6B.)

Figure 7:
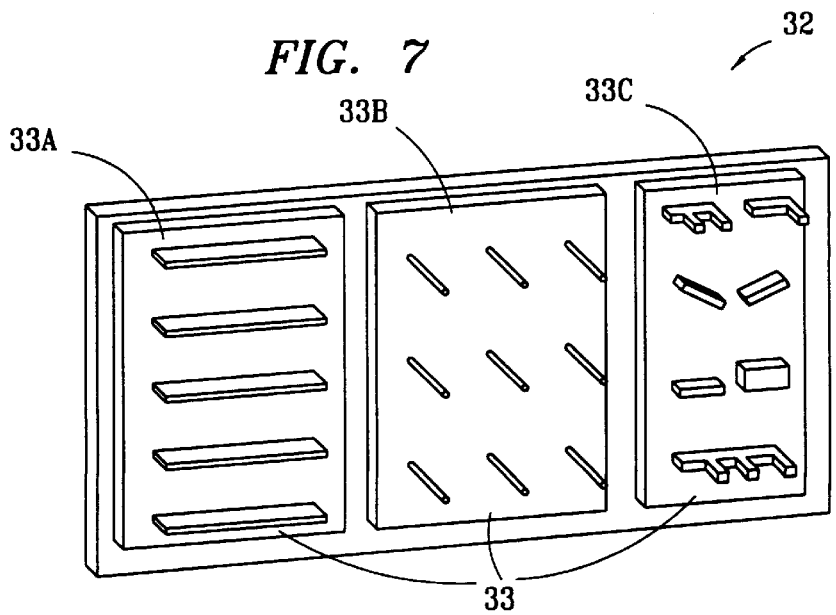
FIG. 7 is a perspective view of an electronic card having a plurality of heat sinks located on the card.

Referring to FIG. 7, there is provided a perspective view of the electronic card 32 including various configurations of a heat sink 33. The heat sink 33 and electrical components 31 may be located on either side of the electronic card 32. The use of a heat sink 33 is optional. Several configurations of the heat sink 33 may be attached to the electronic card 32 where each heat sink is designed to absorb heat generated by the electrical components 31 and to transfer the absorbed heat to the heat transfer fluid 36. The several configurations illustrated include thin vertical strips 33A, pin fins 33B, and multi-angled diverters 33C. The diverters 33C are configured to attract heat transfer fluid 36 for cooling and to divert the flow of heat transfer fluid for improved distribution to electrical components 31 on an adjacent electronic card 32 positioned in a wake of the diverters 33C.

Referring again to FIGS. 2–5, the spraying system further includes a plurality of collection modules 38 strategically placed within the closed compartment 22. The placement of collection modules 38 is determined based on whether the enclosure 100 is, used in an airborne or ground based application. For enclosure 100 utilized in an airborne application the collection modules 38 may be located at the eight corners of the closed compartment 22 such that the collection and distribution of heat transfer fluid 36 would continue independent of the orientation of the enclosure. Whereas, for a ground based application of the enclosure 100, at least one collection module 38 is located on the bottom of the closed compartment 22. Four collection modules 38 located on the bottom of the closed compartment 22 further provides some additional pitch and roll protection.

Each collection module 38 may include a filter protector 39 (see FIGS. 3a and 3b) to remove undesirable particulates from the heat transfer fluid 36 thereby minimizing nozzle clogging, pump wear and deposition of particulates on the electronic cards 32. The collection modules 38 also include fluid sensors 47 (see FIG. 3), valves and relays that are monitored and controlled to ensure the effective operation of the spraying system is independent of orientation due to gravity and/or externally applied "g" forces. The effective operation of the spraying system may include detection of the heat transfer fluid 36 within the collection modules 38.

The collection modules 38 are interconnected by tubes 44 to a fluid enclosure 46. The fluid enclosure 46 is in fluid communication with an inlet 48 of a pump 50 that has an outlet 52 in fluid communication with an array of nozzles 54 mounted to a spray manifold 53. A redundant pump 41 (see FIG. 4) may be provided to ensure the continued operation of the spraying system if the pump 50 fails. The array of nozzles 54 mounted to the spray manifold 53 includes at least one nozzle positioned to distribute and project a fine mist of the heat transfer fluid 36 over a substantial portion of the electronic cards 32. The spray manifold 53 includes a spout 55 (FIG. 2) used for draining the heat transfer fluid 36 located within the spray manifold and the nozzles 54. Preferably, the fluid collection modules 38, the tubes 44, fluid enclosure 46 and pump 50 are located within the closed compartment 22, however, these components may be located external of the closed compartment. It should be noted that the enclosure 100 will continue to function where only tubes 44 are used to collect the heat transfer fluid 36 in lieu of the collection modules 38.

A diagnostic system 120 (see FIG. 3A) includes a pressure sensor 114 and a temperature sensor 116. Each sensor outputs a control signal indicative of the pressure or temperature within the closed compartment 22. The diagnostic system 110 may also include a pump pressure sensor 118 and a flow rate sensor 122 associated with the pump 50. Each sensor outputs diagnostic signal indicative of the pressure within the pump 50 and the flow rate of the heat transfer fluid 36 within the pump.

Referring to FIGS. 8–13, there are illustrated schematics of nozzles 54 mounted in various arrays and having various distribution patterns to assure a substantial portion of the electronic cards 32 are covered by the thin-film of heat transfer fluid 36. The various arrays include quantities of nozzles 54 to ensure the proper distribution of the heat transfer fluid. Each nozzle 54 includes a second screen filter 57 (FIG. 9) to remove undesirable particulates from the heat transfer fluid 36.

First, referring to FIGS. 8 and 9, there are illustrated nozzles 54 positioned at an end of the card cage 30 (see FIG. 14) such that the droplets of the spray patterns of the heat transfer fluid 36 are deflected off electronic cards located within the card cage 30. The nozzles 54 are located at different positions in FIGS. 8 and 9. Vapor baffles 59 (FIG. 9) surrounding the electronic cards 32 are provided to direct the flow of the vaporized heat transfer fluid 36.

Figure 10:
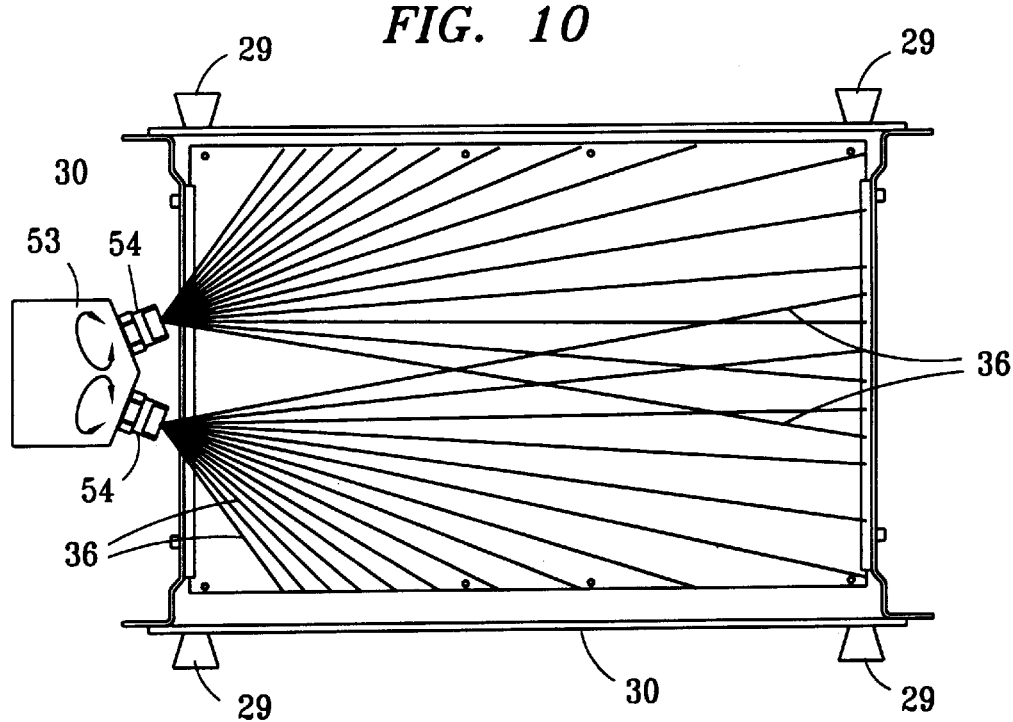
FIG. 10 is a plan view of rotated nozzles that distribute heat transfer fluid within the card cage.

Second, referring to FIG. 10, there is illustrated nozzles 54 that rotate at the end of the card cage 30 to distribute the heat transfer fluid 36. The nozzles 54 may be positioned at different angles relative to one another in order to vary the distribution of the droplet spray.

Figure 11:
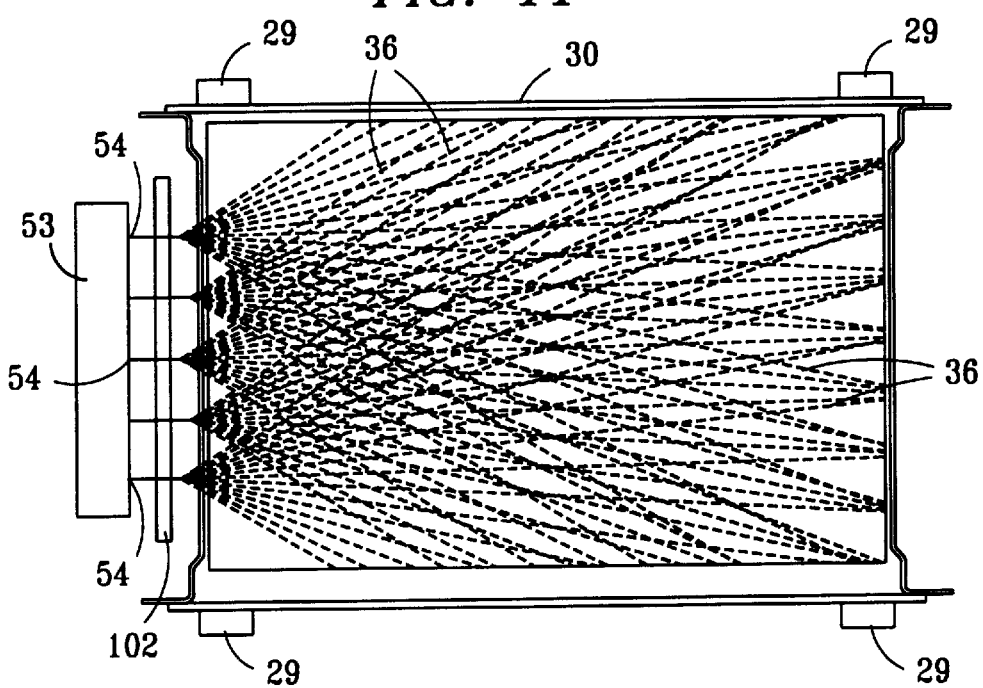
FIG. 11 is a plan view of an array of fluid exit ports projecting the heat transfer fluid through a screen that divides and dispenses the fluid as the fluid enters the card cage.

Third, referring to FIG. 11, there is illustrated an array of nozzles 54 that direct droplet sprays of the heat transfer fluid 36 at a screen 102 in order to atomize and distribute the fluid within the card cage 30. The droplet sprays of the heat transfer fluid 36 have been illustrated to indicate time/flow fluctuation.

Figure 12:
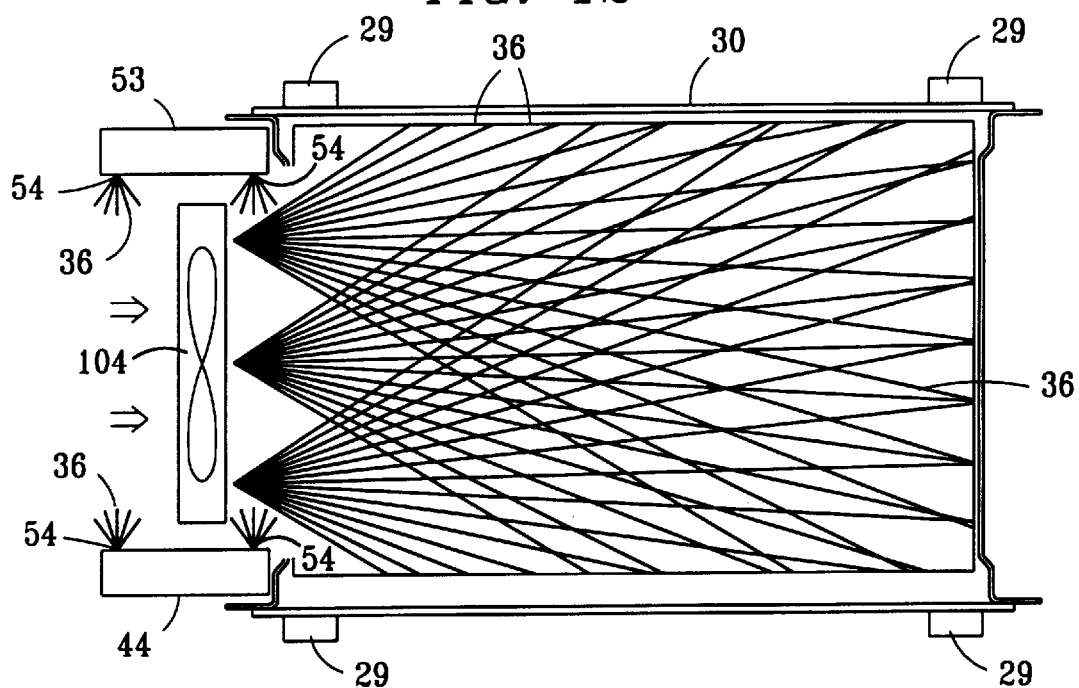
FIG. 12 is a plan view of a fan that distributes within the card cage the heat transfer fluid emitted from an array of nozzles and/or tubes.

Fourth, referring to FIG. 12, there is illustrated an atomizing fan 104 positioned between or on a side of the nozzles 54. The atomizing fan 104 aids in distributing the heat transfer fluid 36 within the electronic cage 30.

Figure 13:
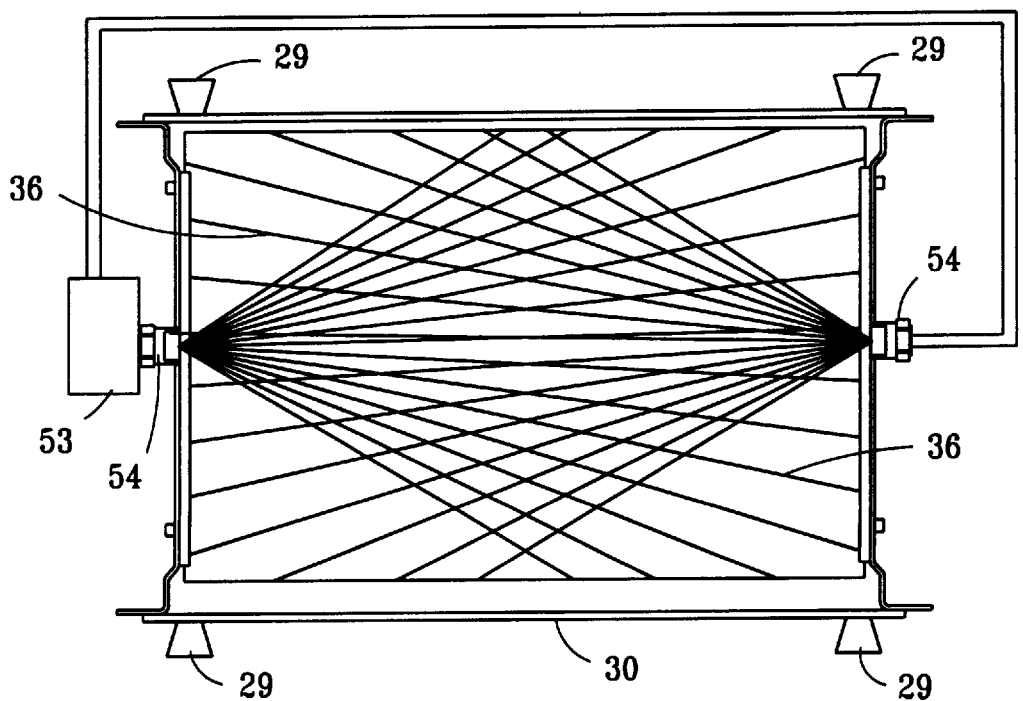
FIG. 13 is a plan view of nozzles positioned at opposite ends of the card cage.

Finally, referring to FIG. 13, there is illustrated nozzles 54 positioned at opposite ends of the card cage 30. The position of the nozzles 54 further assures a substantial portion of the electronic cards 32 are covered by the thin-film of heat transfer fluid 36.

Figure 14:
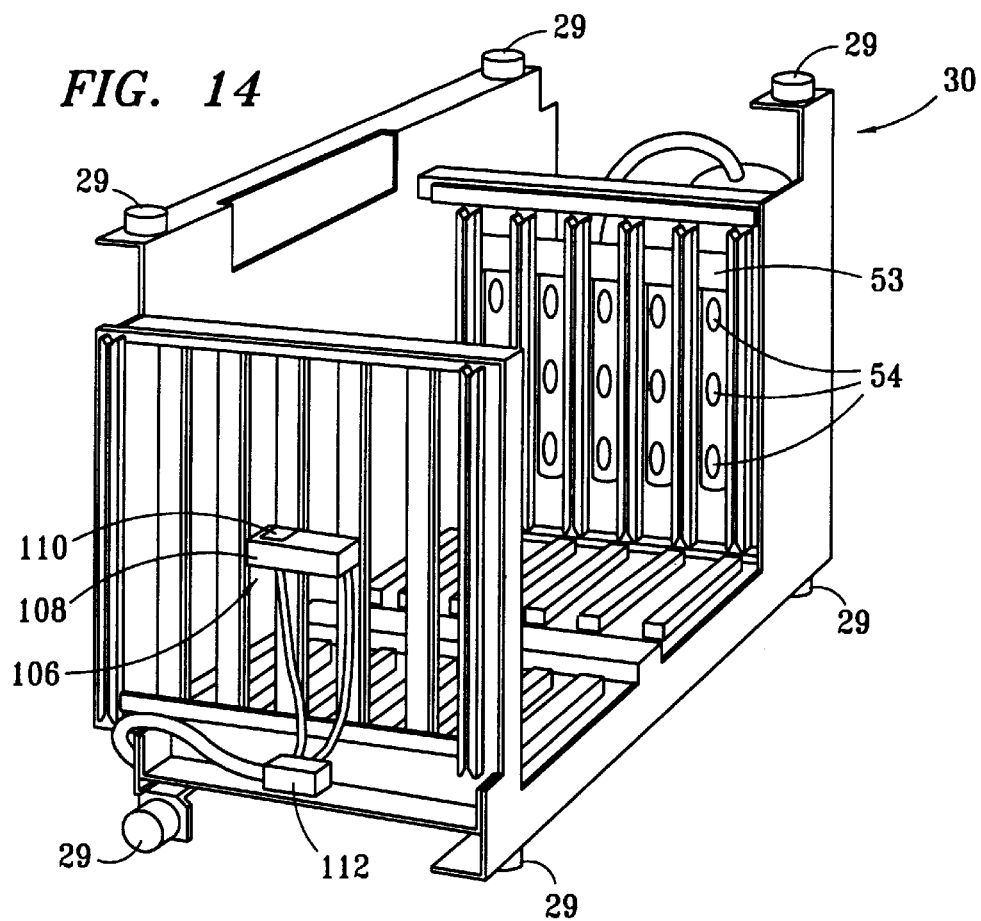
FIG. 14 is a perspective view of the card cage equipped with a heat flux sensor.

Now referring to FIG. 14, there is illustrated a perspective view of the card cage 30. The card cage 30 includes a plurality of vibration and stock isolators 29 located on the corners and/or edges of the card cage. The shock isolators 29 reduce vibrational and shock levels associated with the electronic cards 32.

The card cage 30 further includes a flux sensor 106 located at an end opposite the array of nozzles 54. The flux sensor 106 measures a temperature rise within the closed compartment 22 due to a known amount of heat dissipated. The flux sensor 106 includes a first thermocouple 108 wrapped around a resistor 110 and a second thermocouple 112 located adjacent to the resistor. The resistor 110 is sized to dissipate a known amount of heat. The flux sensor 106 is located on the electronic card 32 or on the card cage 30 and is positioned to be in the spray path. The flux sensor 106 can be used to determine the presence or absence of heat transfer fluid 36 for fault detection purposes. Also, a pressure sensor 114 (FIG. 3A) may indicate a measurement that corresponds to the temperature of the hottest electronic component 31 located in the enclosure 100.

Referring again to FIGS. 2–5, there are illustrated four embodiments of a condensing system 56 that function to condense the vaporized heat transfer fluid 36. The condensing system 56 absorbs a substantial amount of the heat in the vaporized heat transfer fluid 36 to maintain a steady state environment. The condensed heat transfer fluid 36 is then recycled through the spraying system.

The first embodiment of the condensing system 56 is illustrated in FIG. 2. The condensing system 56 includes two fans 58 that draw cool air across the closed compartment 22 from an air intake 60. Convective cooling of the condensing system 56 results from cool air passing over the closed compartment 22 which reduces the temperature of the exterior walls of the closed compartment and causes the vaporized heat transfer fluid 36 to condense. A plurality of external fins 25 are located on the exterior wall of the closed compartment 22 to increase the surface area of the exterior wall. The fans 58 and air intake 60 are mounted to the spray cooled chassis 100. A temperature controller 46 located within or externally (FIG. 4) of the closed compartment 22 may be used in conjunction with at least one heater 35 to maintain the heat transfer fluid 36 at a desired temperature. The heater 35 may be disposed within the heat transfer fluid 36 located at the bottom of the closed compartment 22.

Figure 3A:
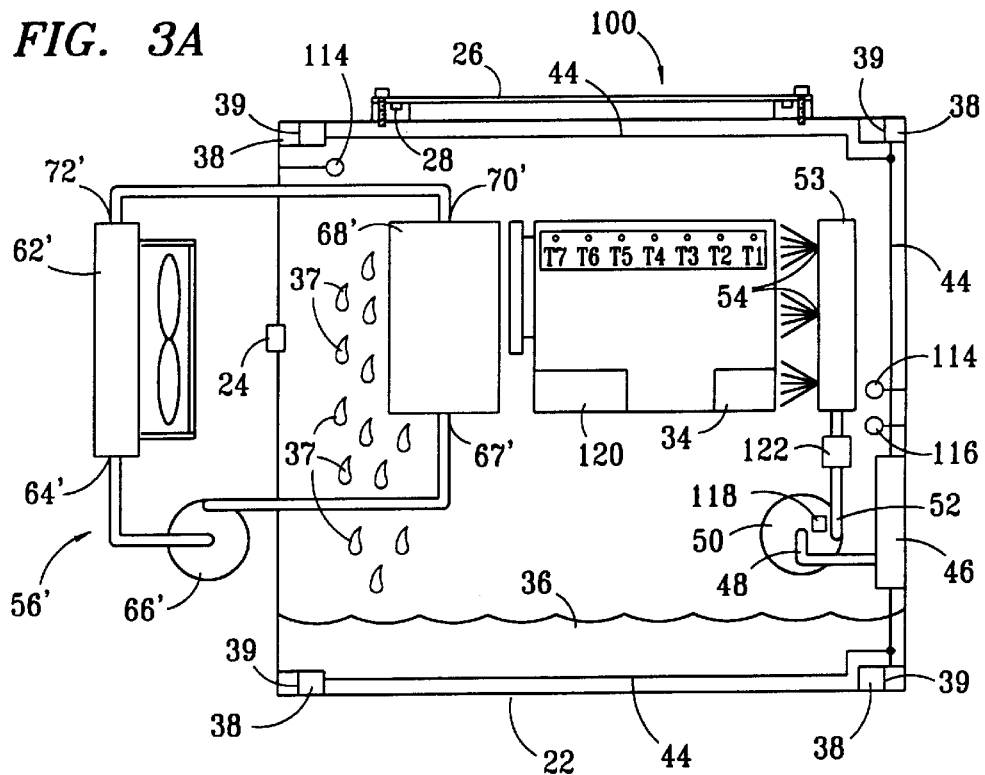
FIG. 3A is a schematic diagram of a second embodiment where a heat exchanger is located externally of a sealed component of the spray cooled enclosure.
Figure 3B:
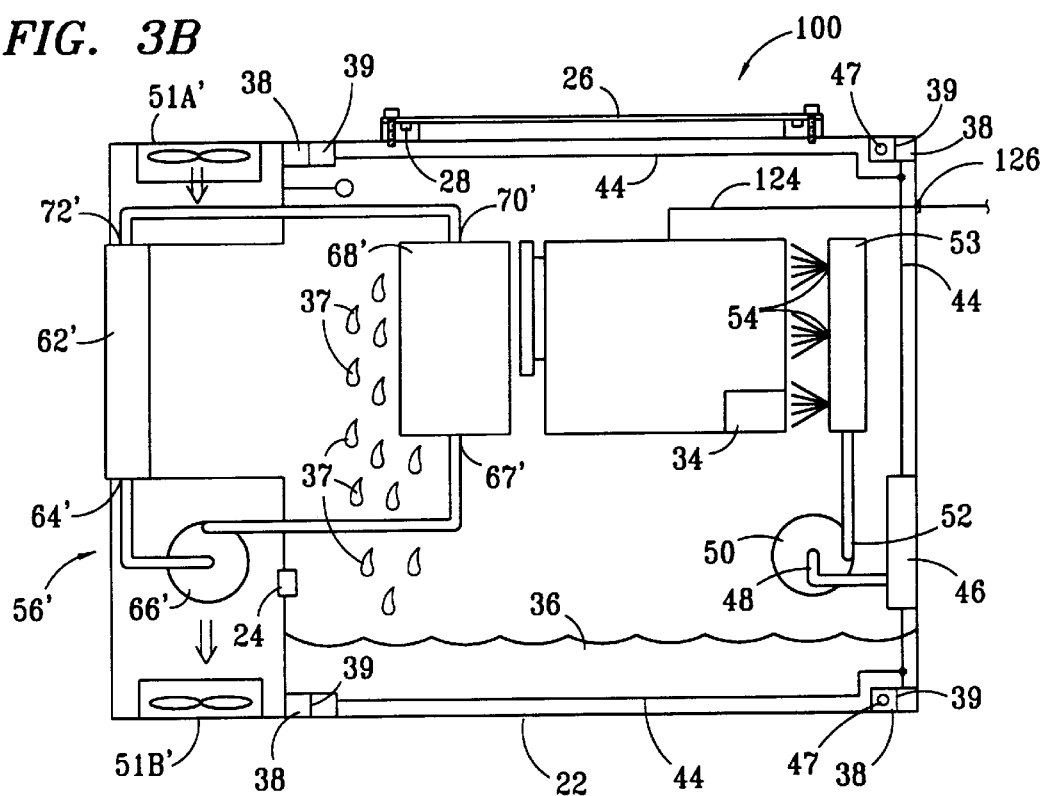
FIG. 3B is a schematic diagram of a second embodiment where the heat exchanger has a portion integral with the closed compartment of the spray cooled enclosure.

Referring to FIGS. 3A and 3B, there are illustrated schematic diagrams of the second embodiment of the condensing system 56 illustrated by primed reference numbers. The condensing system 56' includes an external heat exchanger 62' remotely positioned from the closed compartment 22 (FIG. 3A), or the heat exchanger 62' may have a portion integral with the closed compartment 22 (FIG. 3B). The closed compartment 22, illustrated in FIG. 3B, includes a top fan 51A' and a bottom fan 51B' circulating air onto the heat exchanger 62'. The external heat exchanger 62' has an outlet 64' in fluid communication with an inlet 67' of a condenser 68' located within the closed compartment 22. To close the cycle, the condenser 68' has an outlet 70' in fluid communication with an inlet 72' of the external heat exchanger 62'. A coolant pump 66' is in fluid communication with the heat exchanger 62' and the condenser 68'. The coolant pump 66' may be located before or after the heat exchanger 62'. A cooling fluid circulates through the external heat exchanger 62' and the condenser 68' by operation of the coolant pump 66' such that when the vaporized heat transfer fluid 36 contacts the condenser 68' the heat transfer fluid condenses into droplets 37.

Figure 4:
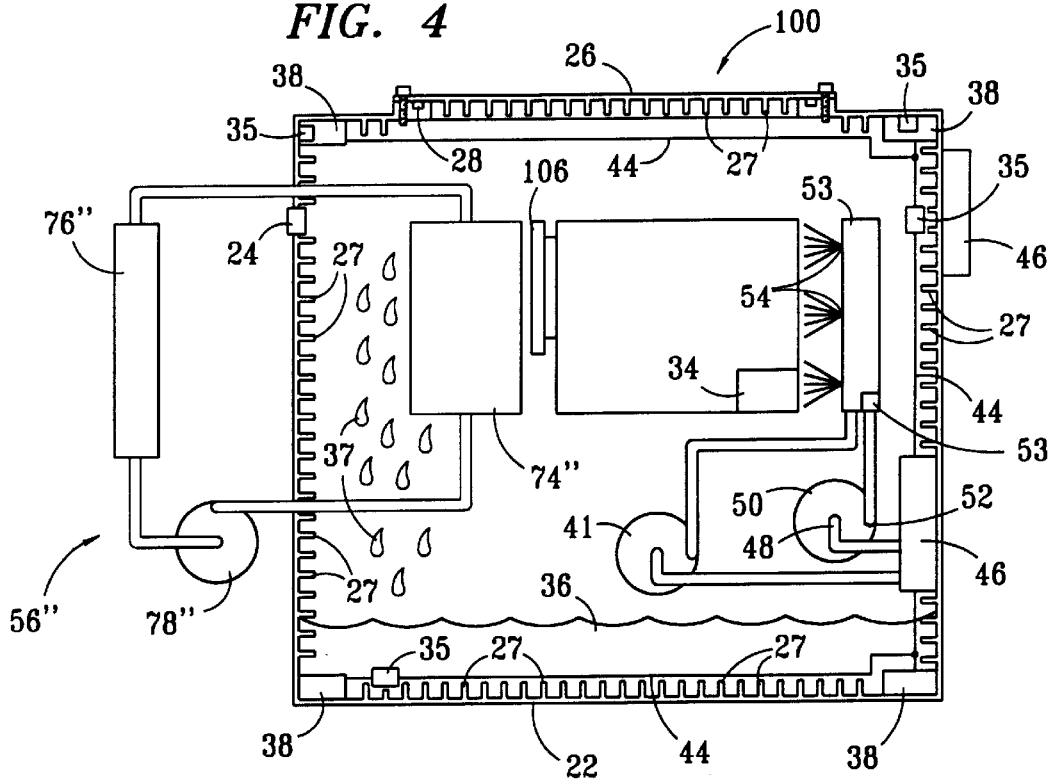
FIG. 4 is a schematic diagram of a third embodiment of the spray cooled chassis.

Referring to FIG. 4, there is illustrated a schematic diagram of the third embodiment of the condensing system 56 illustrated by double prime numbers. The condensing system 56" includes an internal heat exchanger 74" located within the closed compartment 22, and a remote heat exchanger 76" located outside of the closed compartment. The internal heat exchanger 74" and the remote heat exchanger 76" are in fluid communication. A cooling fluid circulates through heat exchangers 74" and 76" by operation of a cooling pump 78". Heat from the vaporized heat transfer fluid 36 is absorbed by the cooling fluid circulating through the internal heat exchanger 74" such that the vaporized heat transfer fluid 36 condenses into a liquid state. A plurality of fins 27 are located on the interior wall of the closed compartment 22 to increase the surface area of the interior wall. Also, there may be provided a plurality of heaters 35 located within the tubes 44, the spray manifold 54, and/or the collection modules 38 to maintain the heat transfer fluid 36 at a desired temperature. The heaters 35 are responsive to a control signal output from the temperature controller 46.

Figure 5:
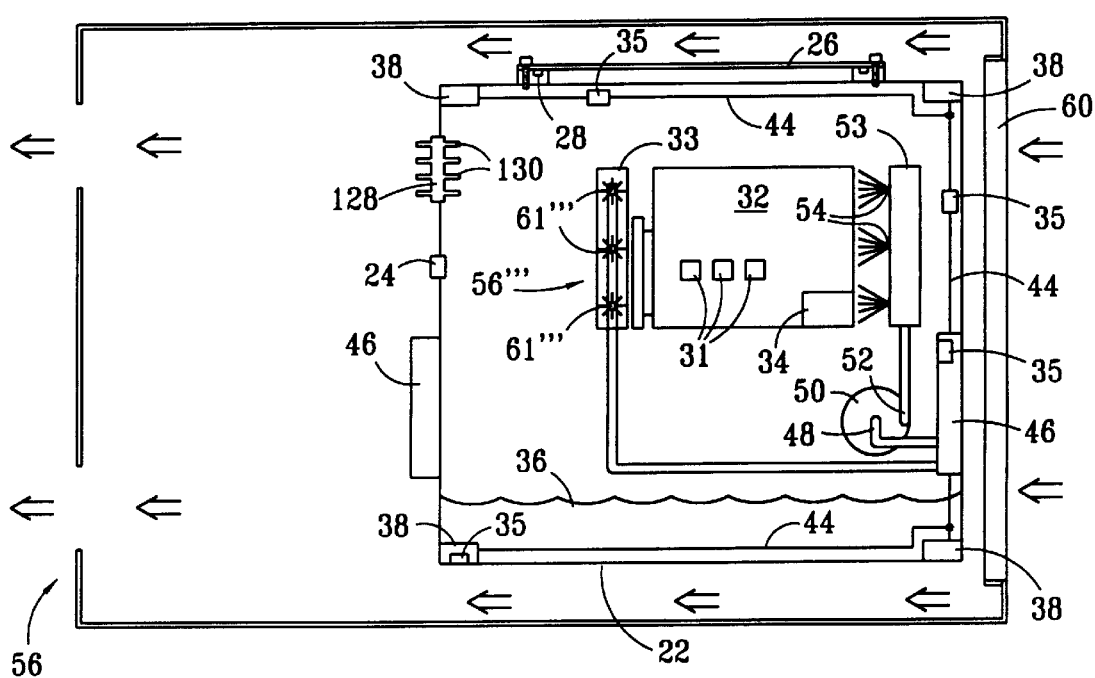
FIG. 5 is a schematic diagram of a fourth embodiment of the spray cooled chassis.

Referring to FIG. 5, there is illustrated a schematic diagram of the fourth embodiment of the condensing system 56 illustrated by triple prime numbers. The condensing system 56'" includes at least one condensing nozzle 61'" located at an end of the card cage 30 opposite the nozzles 54 and in fluid communication with the spray manifold 53. Each condensing nozzle 61'" distributes the heat transfer fluid 36 in a direction substantially perpendicular to the direction of the heat transfer fluid sprayed from the nozzles 54. Also, heat sinks 33 may be provided and positioned near the condensing nozzle 33'" to collect the heat transfer fluid 36. Condensation of the vaporized heat transfer fluid 36 occurs naturally when the vaporized heat transfer fluid 36 contacts a stream of cooler heat transfer fluid distributed from the condensing nozzle 61'''. The condensing nozzle 61''' may be incorporated with the other embodiments of the condensing system 56 to further increase cooling efficiency.

The spray cooled enclosure 100 utilized in airborne based applications may have an environmental control system (ECS) integral with an aircraft. The environmental control system (see FIG. 5) provides the external cooling to either of the two embodiments-of the closed-loop condensing system 56 illustrated in FIGS. 3A–3B and 4.

In operation, the heat transfer fluid 36 is pumped through the array of nozzles 54 producing a fine droplet mist of cooling medium. The fine droplet mist of heat transfer fluid 36 is continually sprayed down each electronic card 32 located in the card cage 30 and covers substantially both sides of the electronic card. The thin-film layer of heat transfer fluid 36 impacts the electronic components 31 or the heat sink 33 and a convective and/or evaporative process transpires. Heat generated from the electronic components 31 transfers to the thin-film layer of heat transfer fluid 36 that evaporates a portion of the heat transfer fluid 36 into a vapor. The thin-film of heat transfer fluid 36 on the electronic components 31 that evaporated is replaced and maintained by a substantially continuous flow of the droplet mist from the nozzles 54.

The evaporation process removes sufficient heat and maintains the temperature of the electrical components 31 near the boiling point of the heat transfer fluid. In the event electrical components 31 are not generating a sufficient amount of heat to vaporize the thin-film of heat transfer fluid 36 the temperature of the electrical components will be near the temperature of the heat transfer fluid 36. The net result of the spray cooling process is a reduction of thermal gradients across the electronic cards 32.

Thereafter, a mixture of vapor and droplets of heat transfer fluid 36 exits through the card cage 30 at the end opposite the nozzles 54. The condensing system 56 then removes heat from the vapor and droplets of heat transfer fluid 36 such that a phase change occurs resulting in a liquified fluid.

Figure 15:
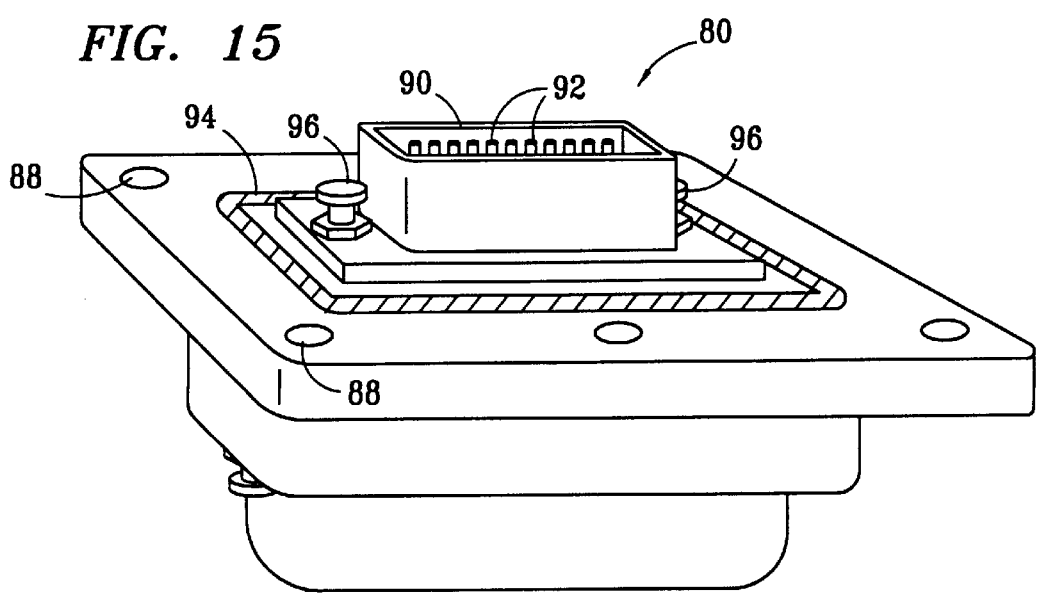
FIG. 15 is a perspective view of a hermetic connector for use with the spray cooled chassis of the present invention.

Referring to FIG. 15, there is illustrated a perspective view of a hermetic connector 80 for use with the closed compartment 22. The hermetic connector 80 includes a connector body 86 having a mounting plate that overlaps an opening in the sealed compartment 22 (FIG. 2), and maintains a pressure seal while electrical or optical connections are made by means of a pair of mating connectors 82 and 84 each having a contact area 90. The contact area 90 includes a plurality of single piece pins or sockets 92 connecting to similar pins of the mating connector 82 (FIG. 2). The pair of mating connectors 82 and 84 are located internally and externally of the closed compartment 22, respectively.

The hermetic connector 80 includes the connector body 86 having a plurality of mounting holes 88. The hermetic connector 80 further includes an o-ring seal 94 surrounding the connector 84 and squeezed between the connector body 86 and the interior side of the closed compartment 22 (FIG. 2). A plurality of mounting screws extend through the mounting holes 88 and attach the connector body 86 to the closed compartment 22 to seal the compartment.

The hermetic connector 80 also includes a plurality of slide-lock posts 96 incorporated on the external side and the internal side of the connector body 86. The slide-lock posts 96 are configured for connecting mating connectors to the connectors 82 and 84.

Another type of connector that may be used for providing input and output to the closed compartment 22 may include discrete wires 124 (see FIG. 3B) extending through the wall of the closed compartment 22. A sealing component would be used in the area between the wires and opening in the wall.

Also, a printed circuit board 128 (see FIG. 5) having multiple pins 130 extending through both sides of the board may function as a connector. The printed circuit board 128 may encompass an entire side of the closed compartment 22 if large amounts of inputs/outputs are required. The printed circuit board 128 would also provide the same physical characteristics as the remaining walls of the closed compartment 22. An integrated backplane having standard bus structures and terminations may be used in lieu of the printed circuit board 128.

Although multiple embodiments of the spray cooled chassis of the present invention have been illustrated in the accompanying Drawings and described in the foregoing Detailed Description, it will be understood that the invention is not limited to the embodiments shown, but is capable of numerous rearrangements, substitutions and modifications without departing from the spirit of the invention.

What is claimed is:

1. A hermetic connector for mounting in an opening in a side of a container, comprising:

a connector body having a passage with an external end and an internal end, said connector body including a mounting plate extending radially therefrom;

a first connector and a second connector, the first and second connectors interconnected and assembled in a sealed relationship into the passage of the connector body, the first of said connectors terminating at the external end of the passage and the second of said connectors terminating at the internal end of the passage;

a seal surrounding the connector body and in contact with the mounting plate, said seal compressed between the side of the container and the mounting plate; and a plurality of slide-lock posts on the external end of the passage and on the internal end of the passage of the connector body, said slide-lock posts for connecting with mating connectors, the center to center spacing for the plurality of internal slide lock posts being no greater than center to center spacing for the plurality of the external slide lock posts.

2. A hermetic connector as set forth in claim 1 wherein said first and second mating connectors each have a contact area comprising connective pins or sockets, the pins or sockets of the first connector connected to corresponding pins or sockets of the second connector.

* * * * *